(12) United States Patent
Asakawa et al.

(10) Patent No.: US 7,790,595 B2
(45) Date of Patent: Sep. 7, 2010

(54) MANUFACTURING METHOD IMPROVING THE RELIABILITY OF A BUMP ELECTRODE

(75) Inventors: Tatsuhiko Asakawa, Fujimi-cho (JP); Shuichi Tanaka, Chino (JP); Hideo Imai, Shimosuwa-machi (JP)

(73) Assignee: Seiko Epson Corporation, Tokyo (JP)

( * ) Notice: Subject to any disclaimer, the term of this patent is extended or adjusted under 35 U.S.C. 154(b) by 1004 days.

(21) Appl. No.: 11/428,705

(22) Filed: Jul. 5, 2006

(65) Prior Publication Data
US 2007/0010045 A1 Jan. 11, 2007

(30) Foreign Application Priority Data
Jul. 5, 2005 (JP) .............................. 2005-196642

(51) Int. Cl.
*H01L 21/44* (2006.01)
(52) U.S. Cl. ................ 438/613; 257/737; 257/E23.021
(58) Field of Classification Search ................. 438/613; 257/E23.021, E23.02, 737
See application file for complete search history.

(56) References Cited

U.S. PATENT DOCUMENTS

| | | | |
|---|---|---|---|
| 5,189,502 A * | 2/1993 | Gomi ......................... 257/759 |
| 5,538,920 A * | 7/1996 | Wakabayashi ............... 438/614 |
| 5,707,902 A * | 1/1998 | Chang et al. ................. 438/614 |
| 6,977,213 B1 * | 12/2005 | Tsai et al. .................... 438/612 |
| 7,098,127 B2 * | 8/2006 | Ito .............................. 438/614 |

FOREIGN PATENT DOCUMENTS

JP  A 02-272737  11/1990

OTHER PUBLICATIONS

"The American Heritage College Dictionary"; 2004; Houghton Mifflin Company; Fourth Edition; p. 1037).*

* cited by examiner

*Primary Examiner*—Thao X Le
*Assistant Examiner*—Vicki B Booker
(74) *Attorney, Agent, or Firm*—Oliff & Berridge, PLC (57) ABSTRACT

A method for manufacturing a semiconductor device comprises (a) forming a resin layer that includes at least a plurality of a first and a second resin parts, being separated from each other, over a semiconductor substrate having an electrode pad and a passivation film; (b) forming a resin projection in which the first and the second resin parts are integrated by curing the resin layer; and (c) forming a conductive layer that is being connected electrically to the electrode pad and extending over the resin projection, wherein in process (a), the second resin part is formed at least between the electrode pad and the first resin part at a width less than the first resin part.

2 Claims, 5 Drawing Sheets

MANUFACTURING METHOD IMPROVING THE RELIABILITY OF A BUMP ELECTRODE

The entire disclosure of Japanese Patent Application No. 2005-196642, filed Jul. 5, 2005 is expressly incorporated by reference herein.

BACKGROUND OF THE INVENTION

1. Technical Field

The invention relates to a method for manufacturing a semiconductor device.

2. Related Art

To improve reliability of an electrical connection, there is developed a semiconductor device having, as an external terminal, a resin core bump whose conductive layer is formed on a resin projection. According to this developed device, a conductive layer from an electrode pad extending to over the resin projection is formed, after the resin projection is formed on a semiconductor substrate.

Generally, in a process of forming a conductive layer, to eliminate an oxide layer on the electrode pad, a reverse sputtering of Ar is performed. However, when the reverse sputtering of Ar is performed, carbonization of a surface of the resin projection proceeds as a result, so that insulation resistance of the resin decreases, generating a possibility of giving rise to migration.

Furthermore, in a case of a structure mentioned above, since the conductive layer is formed such as to run over the resin projection of a cubic shape, it is required to prevent the conductive layer from peeling off or breaking a wire JPA2-272737 is an example of related art.

SUMMARY

An advantage of the present invention is to provide improvement of adhesion of the conductive layer and prevention of migration.

(1) A method for manufacturing a semiconductor device according to one aspect of the invention includes: (a) forming a resin layer that includes at least a plurality of a first and a second resin parts, being separated from each other, over a semiconductor substrate having an electrode pad and a passivation film; (b) forming a resin projection in which the first and the second resin parts are integrated by curing the resin layer; and (c) forming a conductive layer that is being connected electrically to the electrode pad and extending over the resin projection, wherein in process (a), the second resin part is formed at least between the electrode pad and the first resin part at a width less than the first resin part.

In this case, it may be able to make the resin projection after the curing to make a start-up portion in a gentle slope by forming a plurality of separated resin parts. This makes it possible to prevent the conductive layer from peeling off or breaking a wire, thus contributing to improving its adhesion.

It should be noted that in the invention, referring to B as being provided above a specified A includes a case where B is provided directly above A and a case where B is provided above A through another part. This is applicable to the following aspects of the invention.

(2) In the above-mentioned method, it is preferable that the first and the second resin parts are subjected to exposure through the same mask and formed in the process (a).

In this case, it may be able to simplify the manufacturing process.

(3) In the above-mentioned method, it is preferable that the second resin part is formed substantially around the entire periphery of the first resin part.

In this case, the start-up portion of substantially the entire periphery of the resin projection may be formed of a gentle slope. This enables the conductive layer to extend from every direction to above the resin projection with high adhesion (4) In the above-mentioned method, it is preferable that in process (c), prior to forming the conductive layer, an oxide film is removed from a surface of the electrode pad by Ar gas while permitting carbonization of the surface of the resin projection to proceed, and that after forming the conductive layer, the resin projection is partially removed using the conductive layer as a mask.

In this case, even if the carbonization of the resin projection proceeds by the Ar gas and a carbonized layer (or a plasma polymerized layer) is formed, since the start-up portion of the resin projection is formed in a gentle slopes this enables the resin projection to be easily removed without leaving the carbonized layer and the like. Particularly, the carbonized layer and the like tend to remain at a root of the resin projection. However, according to an aspect of the invention, it is possible to remove easily the carbonized layer and the like remaining at the root of the resin projection.

BRIEF DESCRIPTION OF THE DRAWINGS

The invention will be described with reference to the accompanying drawings, wherein like numbers reference like elements.

DESCRIPTION OF EXEMPLARY EMBODIMENTS

Embodiments of the invention will be described as follows with reference to the drawings.

Method for Manufacturing a Semiconductor Device

FIG. 1 to FIG. 10 are diagrams that explain a method for manufacturing a semiconductor device according to embodiments of the invention.

Figure 1:
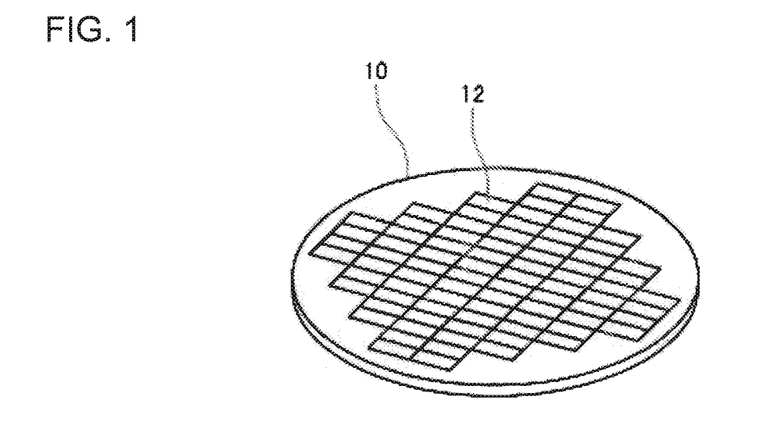
FIG. 1 is a diagram that explains a method for manufacturing a semiconductor device according to one embodiment of the invention.
Figure 2:
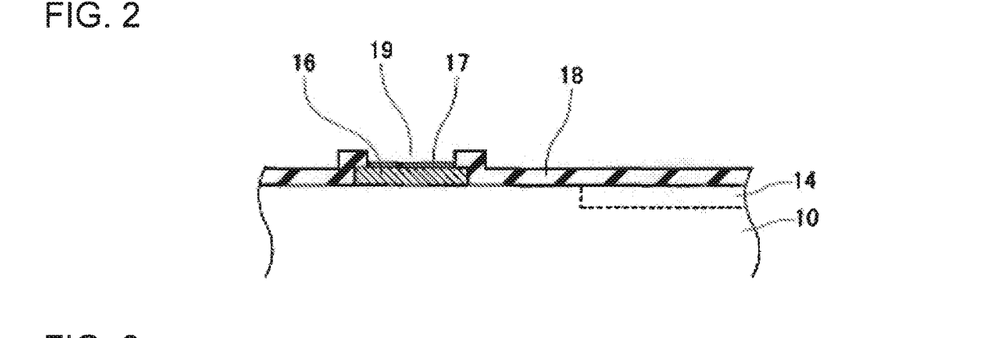
FIG. 2 is a diagram that explains a method for manufacturing a semiconductor device according to one embodiment of the invention.

(1) First, as shown in FIG. 1 and FIG. 2, a semiconductor substrate 10 is prepared. The semiconductor substrate 10 is, for example, a semiconductor wafer (refer to FIG. 1). In that case, the semiconductor substrate 10 has a plurality of chip regions 12 that become semiconductor chips, and an integrated circuit 14 is formed inside each chip region 12. Namely, when splitting the semiconductor substrate 10 into a plurality of chip regions 12, respective semiconductor chips have respective integrated circuit 14. The integrated circuit 14 includes at least an active element such as a transistor.

The chip region 12 is shaped, for example, in a rectangle (for example, an oblong shape) in terms of a plan view. On each chip region 12 are formed a plurality of electrode pads (for example, aluminum pads) 16. The plurality of electrode pads 16 may be arranged on two sides (for example, two sides on long sides) opposite the chip region 12 or on four sides. In that case, a row or a plurality of rows of electrode pads 16 are arranged one on each side.

If the electrode pad 16 is arranged at an end of the chip region 12, the integrated circuit 14 may be formed at a central part surrounded by the plurality of electrode pads 16. Or, the electrode pad 16 may be formed on a region overlapping the integrated circuit in a plan view. The electrode pad 16 is electrically connected to the integrated circuit 14 through internal wiring (not illustrated).

On the surface (formation surface of the integrated circuit 14) of the semiconductor substrate 10 is formed a passivation film (protective film) 18. The passivation film 18 may be formed of either an inorganic type or an organic type. For example, it may be formed of at least one layer of a silicon oxide film or a silicon nitride film.

On the passivation film 18 is formed an opening part 19 that opens the electrode pad 16. At least part (for example, only the central part) of the electrode pad 16 is exposed through the opening part 19. Note that on the electrode pad 16, in many cases, there is formed an oxide layer 17. The oxide layer 17 may be, for example, what is obtained through natural oxidation, covering the surface of the electrode pad 16.

Figure 3:
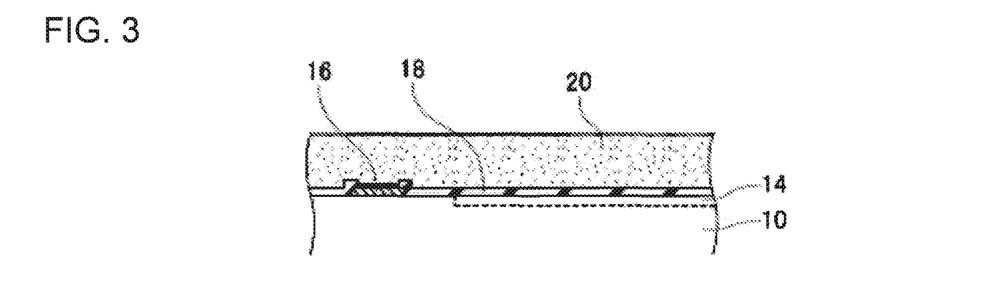
FIG. 3 is a diagram that explains a method for manufacturing a semiconductor device according to one embodiment of the invention.
Figure 4:
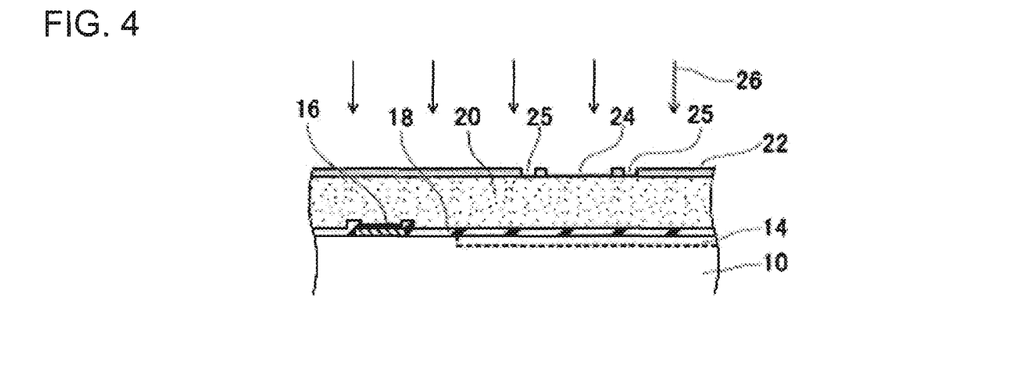
FIG. 4 is a diagram that explains a method for manufacturing a semiconductor device according to one embodiment of the invention.
Figure 5:
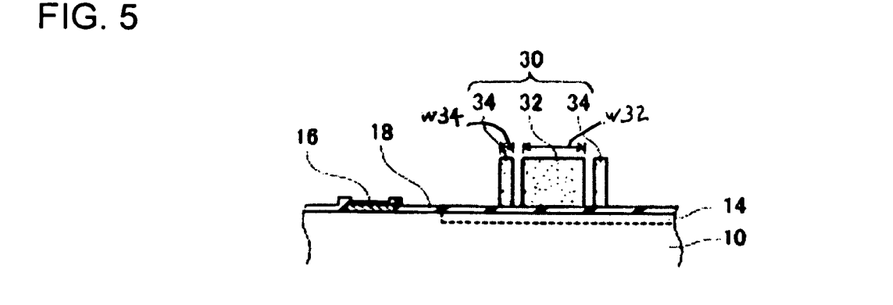
FIG. 5 is a diagram that explains a method for manufacturing a semiconductor device according to one embodiment of the invention.

(2) Next, as shown in FIG. 3 to FIG. 5, a resin layer 30 is formed. The resin layer 30 includes at least a plurality of a first and a second resin parts 32 and 34 of a separated, island shape.

At this point, on the semiconductor substrate 10 (to be specific, on the passivation film 18), in a plan view, the resin layer 30 may be formed on a region different from the electrode pad 16. A formation region of the resin layer 30 is not limited but, for example, may be formed in a straight line having a preset width. In that case, it may be formed such as to extend along a boundary (for example, in a long side direction) of the chip regions 12 of the semiconductor substrate 10 (for example, in parallel).

In an example shown below, there is described an instance of patterning the first and the second resin parts 32 and 34 through photolithography.

Specifically, first, as shown in FIG. 3, a photosensitive resin material 20 is coated, for example, by spin coat, on the semiconductor substrate 10. Thereafter, as shown in FIG. 4, a mask 22 having openings 24 and 25 is placed on the semiconductor substrate 10 and exposed by irradiating an optical energy 26.

Namely, the first and the second resin parts 32 and 34 may be exposed through the same mask and formed. Since this enables the first and the second resin parts 32 and 34 to be formed through the same patterning process, the manufacturing process can be simplified. In a case where there is used, as the resin material 20, a negative type in which solubility of a developing solution decreases at a part subject to irradiation of the optical energy 26, it is possible to leave the resin only at a region that is exposed through the openings 24 and 25 of the mask 22.

Or, conversely, in a case where there is used, as the resin material 20, a positive type in which solubility of a developing solution increases at a part subject to irradiation of the optical energy 26, it is possible to leave the resin only at a region covered by the mask 22. Thereafter, by carrying out the development process, as shown in FIG. 5, the first and the second resin parts 32 and 34 can be subjected to patterning to a preset shape. In an illustrated example, the first resin part 32 is formed through the opening 24 of a large width, while the second resin part 34 is formed by the opening 25 of a small width.

The first and the second resin parts 32 and 34 are formed on the semiconductor substrate 10 in a mutually separated island shape. Namely, the first and the second resin parts 32 and 34 are formed such as to be out of contact with each other. Distance between the two can be adjusted as appropriate depending on the shape of the resin projection 40 after curing that integrates them.

Further, the resin part 34 is formed at least between the electronic pad 16 and the first resin part 32. In an example shown in FIG. 5, the second resin part 34 is formed not only between the electronic pad 16 and the first resin part 32 but also on both sides of the first resin part 32. For example, in a plan view of a surface of the semiconductor substrate 10, it is possible to form the second resin part 34 substantially around the entire periphery of the first resin part 32.

In that case, the second resin part 34 may be formed in a manner of surrounding the first resin part 32 with each separate part as a whole, or it may be formed in a manner of surrounding the first resin part 32 in an integrated ring shape.

Further, the second resin part 34 is formed at a width w34 that is smaller than the width w32 of the first resin part 32. To be specific, the second resin part 34 is formed at a smaller width than the first resin part 32 in a sectional view (the sectional view that perpendicularly cuts a surface on which the electrode pad 16 of the semiconductor substrate 10 including the electrode pad 16 and the resin layer 30 or the resin layer 30 is set up).

It should be noted that as mentioned above, in the case of exposing through the same mask, the first and the second resin parts 32 and 34 have the same height. Namely, a resin amount (volume) of the second resin part 34 can be made smaller than the resin amount (volume) of the first resin part 32. In this manner, by making the width of the resin layer 30 smaller stepwise on the electrode pad 16 side, it is possible to form gently the start-up portion of the resin projection 40, after the curing to be explained later.

Note that as an example of the resin layer 30, there can be cited elastic resin materials such as a polyimide resin, an acrylic resin, a phenol resin, an epoxy resin, a silicon resin, and denatured polyimide resin. Further, as the resin layer 30, for example, there may be used polyimide, polybenzoxasol, benzocyclobutene or epoxy which are aromatics of organic compounds having a benzene ring and its fused ring. It should be noted that the first and the second resin parts 32 and 34 may be formed of the same resin.

As a variation example of the patterning process of the above-mentioned resin layer 30, through a droplet ejection method (for example, an ink-jet method), for example, at least one of the first and second resin parts 32 and 34 may be formed. Further, both the first and second resin parts 32 and 34 may be formed by the droplet ejection method (for example, the ink-jet method). According to this, it is possible to eject directly the resin material only to an necessary region. Especially, according to the ink-jet method, by applying techniques made practical for use with an ink-jet printer, it is possible to provide ink (resin material) at high speed and economically without waste.

Figure 6:
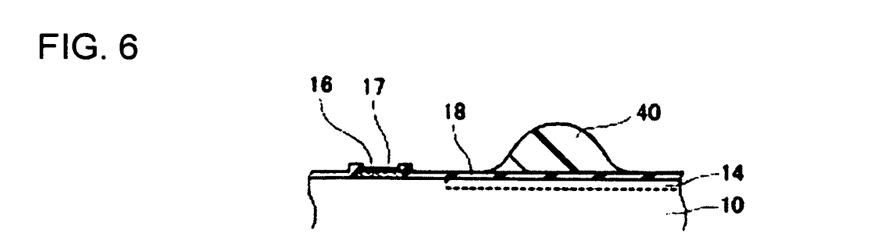
FIG. 6 is a diagram that explains a method for manufacturing a semiconductor device according to one embodiment of the invention.

(3) Next, as shown in FIG. 6, by curing the resin layer 30, a resin projection 40 is formed. The resin projection 40 is an integration of the above-mentioned first and the second resin parts 32 and 34.

To be specific, by heating the resin layer 30, it is fused and thereafter subjected to curing and contracting. Through the curing process, the first and the second resin parts 32 and 34 of the separated island shape are fused and the neighboring parts are integrated. At that time, since the second resin part 34 has less width than the first resin part 32 with a relatively small resin amount, it becomes thin through fusing. Subsequently, curing and contraction of the resin occur, thereby enabling at least the resin projection 40 having a gentle start-up portion on the electrode pad 16 side to be formed.

A surface of the resin projection 40 after the curing has become a curved surface. A section of the resin projection 40 is, for example, in a substantially semicircular shape. A start-up angle (an angle between a tangent to a slope surface in the vicinity of the start-up point and a surface of the passivation film 18) θ is at least θ<90° (θ≈0° to be optimal).

Further, the start-up portion of the resin projection 40 is formed in a curve such as to make a concave relative to an outward direction (slant upward direction). As mentioned above, if the second resin part 34 is formed around the entire periphery of the first resin part 32, it is possible to form a slope surface with a gentle start-up portion in the entire periphery of the resin projection 40. This enables the conductive layer to be explained later to extend to above the resin projection 40 from every direction with high adhesion. Note that integration in this specification includes a state where the first resin part and the second resin part, which are thus far not in contact, contact each other.

Figure 7:
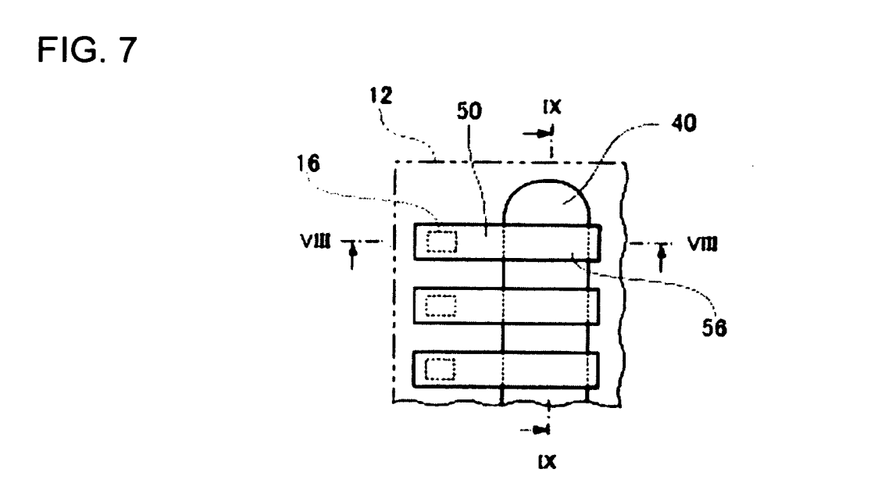
FIG. 7 is a diagram that explains a method for manufacturing a semiconductor device according to one embodiment of the invention.
Figure 8:
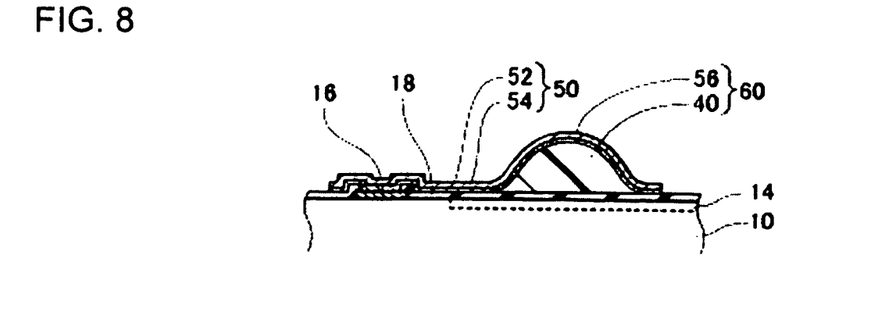
FIG. 8 is a sectional view along line VIII-VIII of FIG. 7.
Figure 9:
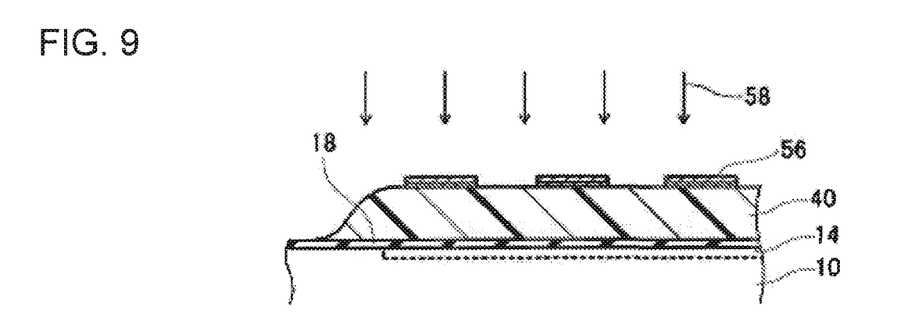
FIG. 9 is a sectional view along line IX-IX of FIG. 7.

(4) Next, as shown in FIG. 7 to FIG. 10, an electrical connection is made to the electrode pad 16, and a conductive layer 50 running over the resin projection 40 is formed. Note that FIG. 7 is a partial plan view after a forming process of the conductive layer, FIG. 8 is a sectional view along line VIII-VIII of FIG. 7, and FIG. 9 is a sectional view along line IX-IX of FIG. 7.

First, before forming the conductive layer 50, the oxide layer 17 on the electrode pad 16 is removed. The oxide layer 17 is, for example, a growth due to natural oxidation or a growth due to the above-mentioned curing process of the resin. As a method of removing the oxide layer 17, for example, reverse sputtering of Ar gas can be applied.

When the reverse sputtering of Ar is applied to the entire surface of the semiconductor substrate 10, this causes carbonization of the surface of the resin projection 40 to proceed. Namely, on the surface of the resin projection 40 is formed a carbonized layer or a layer prior to reaching the carbonized layer (for example, a plasma polymerized layer). Note that this embodiment is particularly beneficial for a case where the carbonized layer and the like are formed in this manner.

The conductive layer 50 can be produced by making a conductive foil through sputtering or vapor deposition to be followed boy subjecting the conductive foil to patterning. The conductive layer 50 can be formed, for example, of a plurality of layers consisting of a first layer (for example, a TiW layer) 52 to serve as an undercoat and a second layer (for example, an Au layer) 54 thereon. In this case, the conductive foil is formed of the first and the second layers 52 and 54, and using a photoresist as a mask, the second layer 54 is subjected to patterning through dry etching, whereas using the second layer 54 after the patterning as a mask, the first layer 53 may be subjected to patterning.

The first layer 52 to serve as the undercoat can be used for preventing metals from diffusing, improving adhesion or as a plated layer. As a variation example, the first layer 52 to serve as the under coat is formed by sputtering or vapor deposition, while the second layer 54 thereon can be formed by electroless plating or electroplating. This enables the second layer 54 to be thickly formed with ease. Or the conductive layer 50 can be formed of a single layer (for example, an Au layer). Note that materials of the conductive layer 50 are not limited to what is mentioned above but, for example, materials such as Cu, Ni, Pd, Al, and Cr can be used.

The conductive layer 50 is a wiring layer electrically connecting between the electrode pad 16 and the resin projection 40. The conductive layer 50 is formed such as to run, at least, over the electrode pad 16, over the passivation film 18, and over the resin projection 40.

In the embodiment, since the start-up portion of the resin projection 40 is formed gently, adhesion of the conductive layer 50 can be enhanced. Consequently, the peeling off and the breaking of a wire of the conductive layer 50 can be prevented. In an example shown in FIG. 8, the conductive layer 50 is formed such as to go over the resin projection 40 and reach over the passivation film 18 on the opposite side of the electrode pad 16.

In other words, the conductive layer 50 is formed such as to branch from the resin projection 40 into a plurality of directions (for example, the electrode pad 16 side and the opposite side thereof) to reach over the passivation film 18. This enables adhesion of the conductive layer 50 with respect to the undercoat to be further enhanced. Note that the conductive layer 50 has an electrical connection 56 formed over the resin projection 40.

Figure 10:
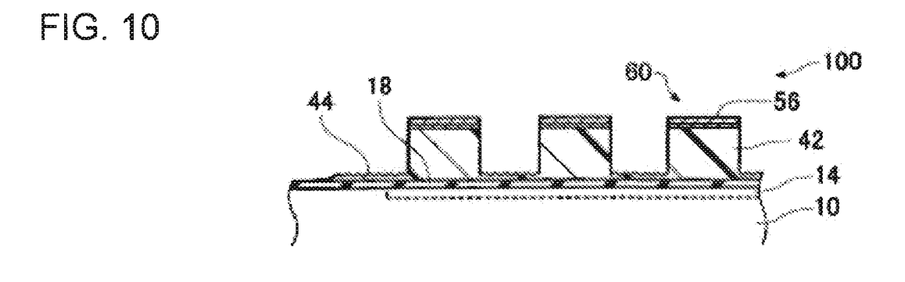
FIG. 10 a diagram that explains a method for manufacturing a semiconductor device according to one embodiment of the invention.

As shown in FIG. 9 and FIG. 10, after forming the conductive layer 50, the resin projection 40 may be partially removed using the conductive layer 50 as a mask. This enables, for example, dischargeableness of an adhesive at the time of mounting to be enhanced. For example, in case of the resin projection 40 formed in a straight line with a preset width such that a plurality of electrical connections 56 are arranged at a preset spacing in a length direction of the resin projection 54, a portion exposed from between adjacent electrical connections 56 is removed by etching with an anisotropic etchant (for example, $O_2$ plasma).

In that case, to prevent the passivation film 18 from being damaged, etching can be performed such as to provide a resin remainder 44 between the adjacent electrical connections 56. According to the embodiment, since the start-up portion of the resin projection 40 is gentle, it is facilitated for the isotropic etchant to enter into the root of the resin projection 40, thus making it possible for the carbonized layer and the like at the root of the resin projection 40 to be removed more easily than before. Consequently, migration due to the carbonized layer and the like can be prevented, thereby improving reliability.

In this manner, a semiconductor device 100 having a plurality of resin core bumps 60 can be manufactured. The resin core bump 60 is formed on one surface (formation surface of the integrated circuit 14) of the semiconductor substrate 10, including a resin projection 42 and the electrical connection 56 formed over the resin projection 42. According to this, since the resin projection 42 becomes a core and that itself has elasticity, it is possible to improve stress relieving function at the time of mounting as well as reliability in electrical connection. Note that the semiconductor device according to the embodiment has a constitution that can be led out of the content of the method for manufacturing the above-mentioned semiconductor device.

Electronic Equipment

Figure 11:
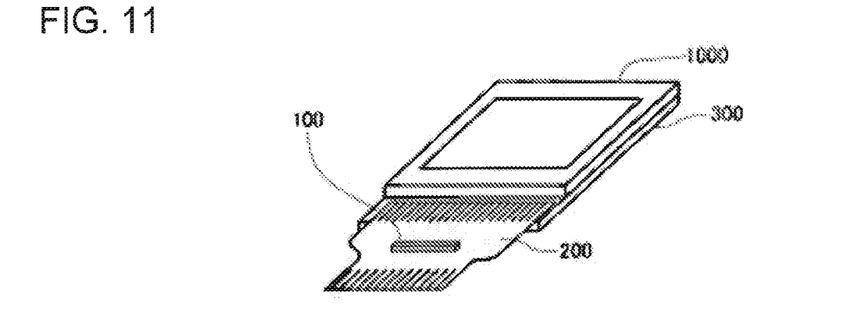
FIG. 11 is a diagram that shows an electronic device according to one embodiment of the invention.

FIG. 11 is a diagram that shows an electronic device according to the embodiment of the invention. An electronic device (for example, a, display device) 1000 includes the semiconductor device 100. In an example shown in FIG. 11, the electronic device 1000 includes the semiconductor device 100, a substrate 200 composed of a resin film and the like, and a second substrate 300 constituted by glass and the like.

The semiconductor device 100 is, for example, mounted on the first substrate 200 face down, and, specifically, a wiring pattern formed on the first substrate 200 and the resin core bump 60 of the semiconductor device 100 are electrically connected. An insulating adhesive not illustrated (for example, non conductive film (NCF) or a non conductive paste (NCP)) is provided between the semiconductor device 100 and the first substrate 200. Or the first substrate 200 may be omitted so that the semiconductor device 100 is mounted on the second substrate 300 face down.

Figure 12:
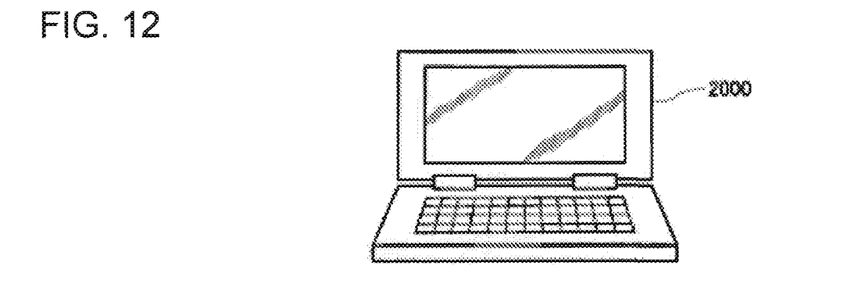
FIG. 12 is a diagram that shows an electronic apparatus according to one embodiment of the invention.
Figure 13:
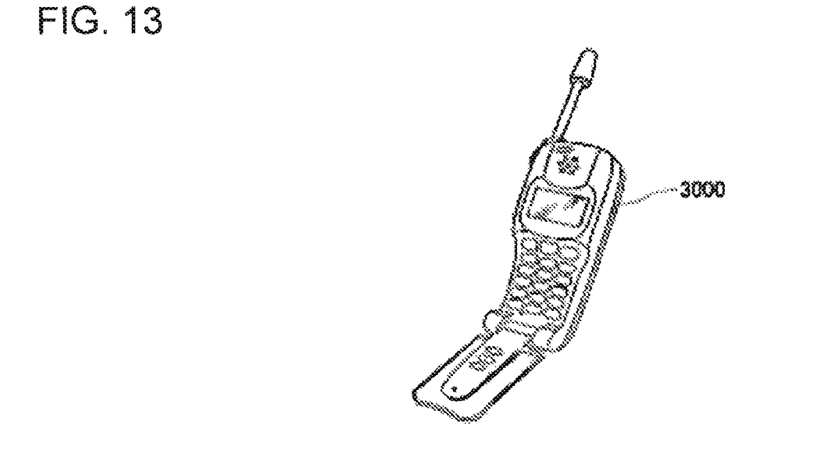
FIG. 13 is a diagram that shows and electronic apparatus according to one embodiment of the invention.

As an example of the electronic device 1000, a liquid crystal display, a plasma display, an electrical luminescence (EL) display and the like may be cited. Note that in FIG. 12, a laptop personal computer is shown as an example of electronic equipment according to the embodiment of the invention. A cell phone is shown in FIG. 13.

First Variation Example

Figure 14:
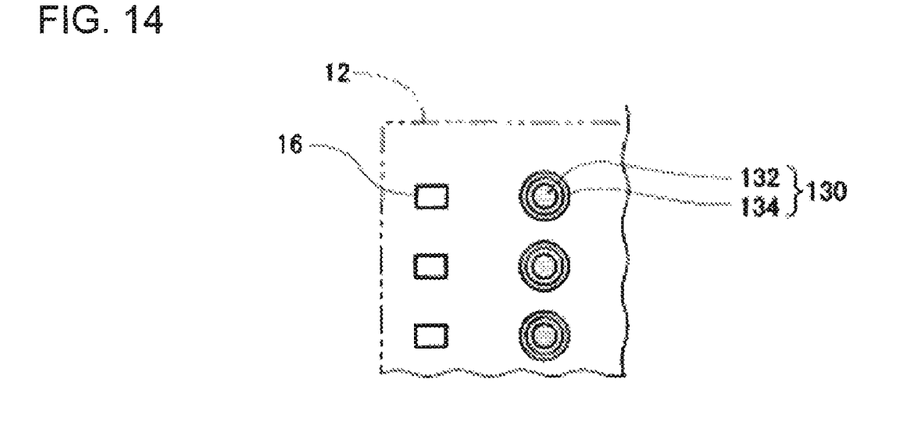
FIG. 14 is a diagram that explains a method for manufacturing a semiconductor device according to a variation example of one embodiment of the invention.
Figure 15:
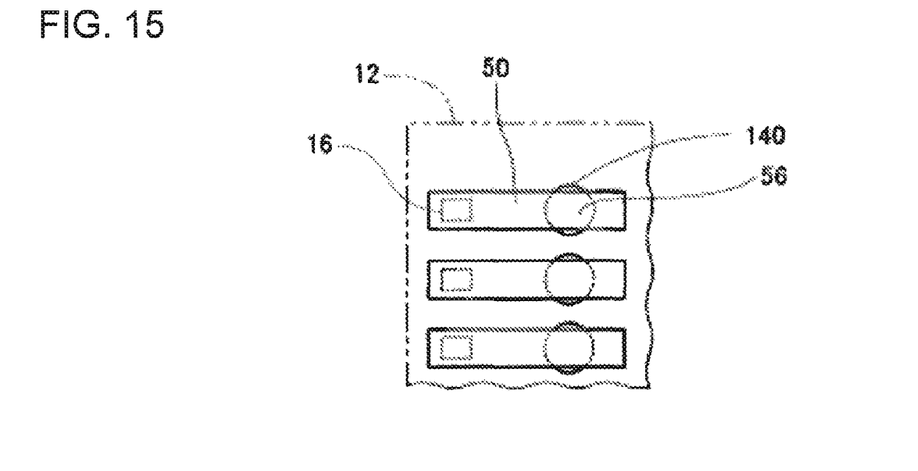
FIG. 15 is a diagram that explains a method for manufacturing a semiconductor device according to a variation example of one embodiment of the invention.

FIG. 14 and FIG. 15 are diagrams that describe a method for manufacturing a semiconductor according to a variation example of the embodiment of the invention. In this variation example, a form of a resin projection 140 (resin layer 130) is different from that which is mentioned above.

The above-mentioned content can be applied to the detail of a forming process of a resin layer 130 prior to curing. For example, in an example shown in FIG. 14, the second resin part 134 is formed in a manner of surrounding the first resin parts 132 through an integral ring shape.

Further, in this variation example, prior to the forming process of the conductive layer 50, a plurality of separated resin layers 130 are formed such that either of the resin projections 140 forms a pair with respect to respective electrode pads 16. For example, after subjecting the plurality of the first resin parts 132 in a columnar shape and the ring shape second resin parts 134 surrounding respective resin parts 132 to patterning and forming, the plurality of resin projections 140 in a semicircular shape through the curing process are formed. This enables the start-up portion at the entire periphery of the resin projection 140 to be formed with a gentle slope surface.

The conductive layer 50 electrically connects between either one of the electrode pads 16 and either one of the resin projections 140. In this case, the conductive layer 50 may be formed in a manner of covering only part of one resin projection 140 or may be formed to cover all of it. In case of the former, by exposing part of the resin projection 140, an external force is released, so that a crack of the electrical connection 56 (conductive layer 50) at the time of mounting can be prevented.

It should be noted that in this variation example, since the resin projections 140 are individually separated in advance and formed, as the above-mentioned example shows, a partial removing process of the resin projection after forming the conductive layer 50 can be omitted.

Second Variation Example

Figure 16:
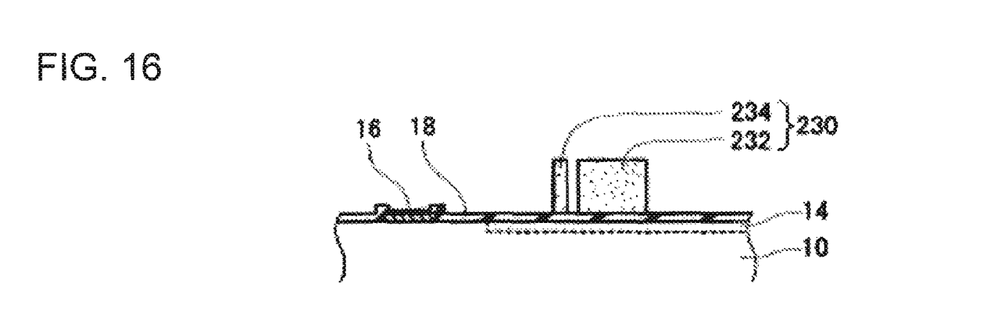
FIG. 16 is a diagram that explains a method for manufacturing a semiconductor device according to a variation example of one embodiment of the invention.
Figure 17:
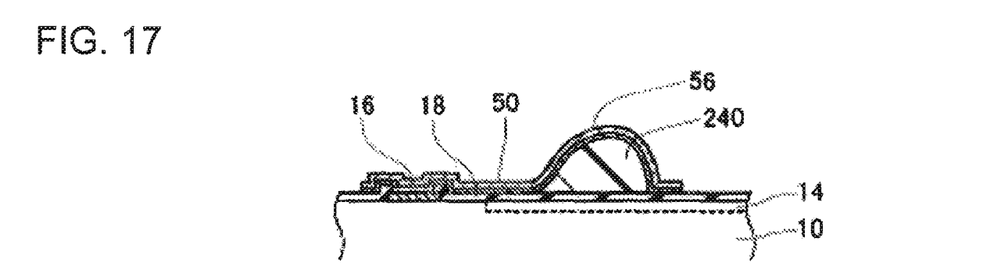
FIG. 17 is a diagram that explains a method for manufacturing a semiconductor device according to a variation example of one embodiment of the invention.

FIG. 16 and FIG. 17 are diagrams that describe a method for manufacturing a semiconductor device according to a variation example of the embodiment of the invention. In this variation example, too, a form of a resin projection 240 (a resin layer 230) is different from the above-mentioned.

In an example shown in FIG. 16, a second resin part 234 is formed (only) between the electrode pad 16 and a first resin part 232. The second resin part 234 is not formed at least on an opposite side to the electrode pad 16 in the first resin part 232. Thereafter, as shown in FIG. 17, by curing the resin layer 230, the resin projection 240 whose start-up portion is gently formed on the electrode pad 16 side can be formed. According to this, the conductive layer 50 is able to provide for at least prevention of the peeling off and prevention of the breaking of a wire, generation of failure of electrical connection can be prevented. Further, as the gentle slope surface is formed only on one side, reduction of a planar area of the resin projection 240 can be achieved.

Other Variation Examples

In this embodiment, so long as a plurality of resin parts of a separated, island-shape are formed prior to the curing, it is acceptable. For example, the plurality of resin parts may be formed through patterning processes for a plurality of times.

Further, in the above-mentioned example, a case of forming the resin layer through the first and the second resin parts was shown. However, the embodiment is not limited to this, and more than three resin parts of the separated, island shape may be formed. In that case, it is possible to form a resin layer including resin parts whose width becomes smaller as they come closer to the electrode pad.

The invention is not limited to the above-mentioned embodiments, but various variations are possible. For example, the invention includes a constitution virtually the same as the constitution described in the embodiment (for example, the constitution having the same function, method and effect or the constitution having the same purpose and effect). Further, the invention includes a constitution which substituted a part not essential to the constitution described in the embodiment. Still further the invention includes a constitution which brings about the same operation/working-effect or a constitution which can accomplish the same purpose. Furthermore, the invention includes a constitution to which a publicly known technique has been added to the constitution described in the embodiment.

What is claimed is:

1. A method for manufacturing a semiconductor device, comprising:
   (a) forming a resin layer over a semiconductor substrate having a plurality of electrode pads and a passivation film, the resin layer having at least one first and second resin-part set, wherein for the at least one first and second resin-part set, the second resin part is separated from and not in contact with the first resin part, the second resin part is formed at least between an electrode pad and the first resin part, and the second resin part has a width less than the first resin part in a lateral direction of a sectional view that perpendicularly cuts through the electrode pad, the at least one first and second resin-part set, and a surface of the semiconductor substrate;
   (b) heating the resin layer to fuse the first and second resin parts in the at least one first and second resin-part set into a common resin projection, and then curing the resin layer; and
   (c) forming a conductive layer on and in contact with each electrode pad and extending over the common resin projection, wherein
   the second resin part is formed in a manner of surrounding the first resin part.

2. The method for manufacturing a semiconductor device according to claim 1, wherein the first and the second resin parts of the resin layer are formed by subjecting a resin material to exposure through a common mask.

* * * * *